United States Patent
Urasaki et al.

(10) Patent No.: US 12,426,415 B2
(45) Date of Patent: Sep. 23, 2025

(54) METHOD OF MANUFACTURING AN OPTICAL SEMICONDUCTOR DEVICE

(71) Applicant: Shenzhen Jufei Optoelectronics Co., Ltd., Shenzhen (CN)

(72) Inventors: Naoyuki Urasaki, Chikusei (JP); Kanako Yuasa, Saitama (JP)

(73) Assignee: Shenzhen Jufei Optoelectronics Co., Ltd., Shenzhen (CN)

( * ) Notice: Subject to any disclaimer, the term of this patent is extended or adjusted under 35 U.S.C. 154(b) by 107 days.

(21) Appl. No.: 17/342,813

(22) Filed: Jun. 9, 2021

(65) Prior Publication Data

US 2021/0296546 A1    Sep. 23, 2021

Related U.S. Application Data

(60) Continuation of application No. 17/169,054, filed on Feb. 5, 2021, which is a continuation of application
(Continued)

(30) Foreign Application Priority Data

Jun. 2, 2006  (JP) .................................. 2006-154652

(51) Int. Cl.
*H10H 20/852*    (2025.01)
*H10H 20/831*    (2025.01)
(Continued)

(52) U.S. Cl.
CPC ........ *H10H 20/856* (2025.01); *H10H 20/831* (2025.01); *H10H 20/8506* (2025.01);
(Continued)

(58) Field of Classification Search
CPC . H01L 2224/16245; H01L 2224/32245; H01L 2224/45144; H01L 2224/48091;
(Continued)

(56) References Cited

U.S. PATENT DOCUMENTS

| | | | |
|---|---|---|---|
| 4,132,563 A * | 1/1979 | Burke, Jr. | B82Y 30/00 523/216 |
| 5,343,076 A | 8/1994 | Katayama et al. | |

(Continued)

FOREIGN PATENT DOCUMENTS

| | | |
|---|---|---|
| CN | 1639224 A | 7/2005 |
| CN | 1639258 A | 7/2005 |

(Continued)

*Primary Examiner* — Maliheh Malek
(74) *Attorney, Agent, or Firm* — Andrew M. Calderon; Calderon Safran & Wright P.C.

(57) ABSTRACT

A method of manufacturing an optical semiconductor device includes disposing an optical semiconductor element on a recessed part of an optical semiconductor element mounting package. The package includes at least two lead electrodes and a thermosetting epoxy resin composition. The lead electrodes are disposed opposite to and spaced apart from each other. Each lead electrode has a top surface, a bottom surface, and a side wall. The lead electrodes are not bent. The thermosetting epoxy resin composition forms a molded part disposed on at least a portion of the top surfaces of the lead electrodes and disposed at a region between the lead electrodes. The molded part together with a portion of each of the lead electrodes form a recessed part for disposing at least an optical semiconductor element. At least one of the side walls of the lead electrodes is not a straight line.

21 Claims, 2 Drawing Sheets

Related U.S. Application Data

No. 16/392,900, filed on Apr. 24, 2019, now Pat. No. 10,950,767, which is a division of application No. 15/865,299, filed on Jan. 9, 2018, now Pat. No. 10,326,063, which is a division of application No. 15/603,618, filed on May 24, 2017, now Pat. No. 10,205,072, which is a division of application No. 12/303,188, filed as application No. PCT/JP2007/060385 on May 21, 2007, now Pat. No. 9,673,362.

(51) Int. Cl.
*H10H 20/85* (2025.01)
*H10H 20/851* (2025.01)
*H10H 20/856* (2025.01)
*H10H 20/857* (2025.01)
*H01L 23/00* (2006.01)

(52) U.S. Cl.
CPC ........ *H10H 20/851* (2025.01); *H10H 20/852* (2025.01); *H01L 24/45* (2013.01); *H01L 24/73* (2013.01); *H01L 2224/16245* (2013.01); *H01L 2224/32245* (2013.01); *H01L 2224/45144* (2013.01); *H01L 2224/48091* (2013.01); *H01L 2224/48247* (2013.01); *H01L 2224/48465* (2013.01); *H01L 2224/73265* (2013.01); *H01L 2924/181* (2013.01); *H01L 2924/1815* (2013.01); *H10H 20/857* (2025.01)

(58) Field of Classification Search
CPC . H01L 2224/48247; H01L 2224/48465; H01L 2224/73265; H01L 2924/181; H01L 2924/1815; H01L 24/45; H10H 20/856; H10H 20/831; H10H 20/8506; H10H 20/851; H10H 20/852; H10H 20/857; H10H 20/854

See application file for complete search history.

(56) References Cited

U.S. PATENT DOCUMENTS

| | | | |
|---|---|---|---|
| 5,793,099 A | 8/1998 | Murakami et al. | |
| 6,274,890 B1* | 8/2001 | Oshio | H10H 20/8506 |
| | | | 257/E33.059 |
| 6,278,827 B1 | 8/2001 | Sugiyama et al. | |
| 6,531,328 B1 | 3/2003 | Chen | |
| 6,670,648 B2 | 12/2003 | Isokawa et al. | |
| 6,924,514 B2* | 8/2005 | Suenaga | H10H 20/8506 |
| | | | 257/E33.059 |
| 6,953,952 B2 | 10/2005 | Asakawa | |
| 7,208,772 B2 | 4/2007 | Lee et al. | |
| 7,260,123 B2 | 8/2007 | Sato | |
| 7,279,719 B2* | 10/2007 | Suehiro | H10H 20/856 |
| | | | 257/E33.068 |
| 7,569,987 B2 | 8/2009 | Naitou | |
| 7,723,407 B2 | 5/2010 | Sugioka et al. | |
| 7,812,360 B2 | 10/2010 | Yano | |
| 7,875,897 B2 | 1/2011 | Suehiro | |
| 7,923,918 B2* | 4/2011 | Tamaki | C09K 11/0855 |
| | | | 313/506 |
| 9,159,884 B2* | 10/2015 | Park | H10H 20/8506 |
| 9,502,624 B2* | 11/2016 | Kuramoto | H10H 20/84 |
| 9,673,362 B2 | 6/2017 | Urasaki | |
| 10,134,961 B2* | 11/2018 | Reiherzer | H10H 20/856 |
| 10,205,072 B2 | 2/2019 | Urasaki et al. | |
| 10,326,063 B2 | 6/2019 | Urasaki et al. | |
| 10,686,102 B2* | 6/2020 | Kuramoto | H10H 20/857 |
| 10,948,163 B2* | 3/2021 | Lee | G02F 1/133606 |
| 10,950,767 B2 | 3/2021 | Urasaki et al. | |
| 2002/0045546 A1 | 4/2002 | Hotta et al. | |
| 2002/0079837 A1* | 6/2002 | Okazaki | H10H 20/853 |
| | | | 257/E33.059 |
| 2003/0080341 A1* | 5/2003 | Sakano | B29C 67/08 |
| | | | 257/E33.059 |
| 2004/0046242 A1* | 3/2004 | Asakawa | H01L 33/486 |
| | | | 257/E33.071 |
| 2004/0061433 A1* | 4/2004 | Izuno | H01L 21/76251 |
| | | | 313/498 |
| 2004/0061810 A1 | 4/2004 | Lowery et al. | |
| 2004/0159850 A1 | 8/2004 | Takenaka | |
| 2004/0211970 A1 | 10/2004 | Hayashimoto et al. | |
| 2005/0093146 A1 | 5/2005 | Sakano | |
| 2005/0127816 A1 | 6/2005 | Sumitani | |
| 2005/0211991 A1* | 9/2005 | Mori | H10H 20/8511 |
| | | | 257/E33.059 |
| 2005/0222300 A1 | 10/2005 | Ikezawa et al. | |
| 2005/0224821 A1* | 10/2005 | Sakano | C09K 11/7774 |
| | | | 257/E33.059 |
| 2005/0245018 A1* | 11/2005 | Bogner | H10H 20/856 |
| | | | 257/E33.072 |
| 2005/0272896 A1 | 12/2005 | Kaji et al. | |
| 2005/0280017 A1* | 12/2005 | Oshio | H10H 20/857 |
| | | | 257/99 |
| 2006/0014873 A1 | 1/2006 | Ikezawa et al. | |
| 2006/0043401 A1* | 3/2006 | Lee | H01L 24/97 |
| | | | 257/99 |
| 2006/0054913 A1* | 3/2006 | Hadame | H01L 24/97 |
| | | | 257/E33.059 |
| 2006/0102917 A1 | 5/2006 | Oyama et al. | |
| 2006/0126344 A1 | 6/2006 | Ueda et al. | |
| 2006/0133044 A1* | 6/2006 | Kim | H10H 20/857 |
| | | | 257/E23.092 |
| 2006/0186431 A1 | 8/2006 | Miki et al. | |
| 2006/0189721 A1 | 8/2006 | Akiyama et al. | |
| 2006/0203347 A1 | 9/2006 | Yang et al. | |
| 2006/0267036 A1* | 11/2006 | Lee | H01L 33/647 |
| | | | 257/E33.072 |
| 2007/0085105 A1* | 4/2007 | Beeson | G02B 19/0061 |
| | | | 257/E33.072 |
| 2007/0108455 A1 | 5/2007 | Sun et al. | |
| 2009/0050925 A1 | 2/2009 | Kuramoto et al. | |
| 2009/0065792 A1* | 3/2009 | Thompson | H10H 20/853 |
| | | | 257/E33.073 |
| 2010/0140638 A1 | 6/2010 | Kotani et al. | |
| 2010/0200882 A1 | 8/2010 | Kotani et al. | |
| 2014/0145225 A1 | 5/2014 | Wu et al. | |
| 2024/0271773 A1* | 8/2024 | Jin | H10H 20/85 |

FOREIGN PATENT DOCUMENTS

| | | |
|---|---|---|
| CN | 1777654 | 5/2006 |
| CN | 101429324 A | 5/2009 |
| JP | 60-123047 A | 7/1985 |
| JP | 02-129953 | 5/1990 |
| JP | 08-089789 A | 4/1996 |
| JP | 09-63329 | 3/1997 |
| JP | 2002-223001 A | 8/2002 |
| JP | 2002-223004 A | 8/2002 |
| JP | 2002-280616 A | 9/2002 |
| JP | 2003-327667 A | 11/2003 |
| JP | 2004-55632 A | 2/2004 |
| JP | 2004-266189 A | 9/2004 |
| JP | 2004-342782 A | 12/2004 |
| JP | 2004-383537 A | 12/2004 |
| JP | 2005-112965 A | 4/2005 |
| JP | 2005-136379 A | 5/2005 |
| JP | 2005-146191 A | 6/2005 |
| JP | 2005-259972 A | 9/2005 |
| JP | 2006-86178 A | 3/2006 |
| JP | 2006-140207 A | 6/2006 |
| JP | 2006-156704 A | 6/2006 |
| JP | 4608294 B2 | 1/2011 |
| KR | 10-2004-0094743 A | 11/2004 |
| KR | 10-2006-0010768 A | 2/2006 |
| TW | 200305609 | 11/2003 |
| TW | 200306331 | 11/2003 |
| TW | 200418210 | 9/2004 |
| TW | 200606208 | 2/2006 |
| TW | 200616265 | 5/2006 |
| TW | 200617093 | 6/2006 |

(56) References Cited

FOREIGN PATENT DOCUMENTS

| WO | 0169678 A1 | 9/2001 |
| WO | WO 03/072628 A1 | 9/2003 |
| WO | WO 03/072655 A1 | 9/2003 |
| WO | WO 2005/090472 A1 | 9/2005 |

\* cited by examiner

METHOD OF MANUFACTURING AN OPTICAL SEMICONDUCTOR DEVICE

CROSS-REFERENCE TO RELATED APPLICATION

This application is a a continuation application of U.S. application Ser. No. 17/169,054 filed on Feb. 5, 2021, which is continuation application of U.S. application Ser. No. 16/392,900 filed on Apr. 24, 2019, now U.S. Pat. No. 10,950,767, which is a divisional application of U.S. application Ser. No. 15/865,299 filed Jan. 9, 2018, now U.S. Pat. No. 10,326,063, which is a divisional application of U.S. application Ser. No. 15/603,618, filed May 24, 2017, now U.S. Pat. No. 10,205,072, which is a divisional application of U.S. application Ser. No. 12/303,188, filed Dec. 2, 2008, now U.S. Pat. No. 9,673,362, which is a 371 of international application PCTJP2007/060385 filed May 21, 2007, which claims benefit of the filing date of Japanese Application No. 2006-154652, filed Jun. 2, 2006, the entire contents of each of which are incorporated herein by reference.

TECHNICAL FIELD

This disclosure relates to an optical semiconductor element mounting package that is useful in manufacturing an optical semiconductor device that combines an optical semiconductor element with a wavelength conversion means such as fluorescent material, and to an optical semiconductor device using the package.

BACKGROUND

Optical semiconductor devices (light emitting devices) of the SMD (surface mounted device) type and having the structure shown in FIG. 3 have often been used in recent years in place of a lead type of optical semiconductor device in an effort to reduce the size and thickness of the optical semiconductor device. With a surface mounted type of optical semiconductor device, usually an optical semiconductor element (LED, etc.) 400 is mounted via a die-bonding material 406 on the bottom face of a recessed part of an optical semiconductor element mounting package in which positive and negative lead electrodes 404 are integrated with a resin molding 403 having a recessed part that serves as the region where the optical semiconductor element will be mounted. And then, the optical semiconductor element 400 and the lead electrodes 404 are electrically connected with a bonding wire 401, after which the recessed part is packed with a transparent sealing resin 402 that includes a fluorescent material 405, and the optical semiconductor element 400 is sealed to complete the manufacture of the optical semiconductor device.

The above-mentioned optical semiconductor element mounting package is usually manufactured by placing lead electrodes in a mold, injecting a molten thermosetting resin composition into the closed mold, and returning the resin composition to room temperature to cure it and integrate the components. Japanese Laid-Open Patent Applications 2002-280616, 2004-055632, and 2004-342782 disclose an SMD-type LED apparatus that makes use of an optical semiconductor element mounting package in which positive and negative lead electrodes and a resin molding having a recessed part are integrated.

SUMMARY

In view of this situation, according to an object of the present disclosure, an embodiment provides a method of manufacturing an optical semiconductor device.

In one embodiment, a method of manufacturing an optical semiconductor device is provided. The method comprises: disposing an optical semiconductor element on a recessed part of an optical semiconductor element mounting package, wherein the package having the recessed part comprises: at least two lead electrodes disposed opposite to and spaced apart from each other, each of the lead electrodes having a top surface, a bottom surface, and a side wall, wherein the lead electrodes are not bent; and a thermosetting epoxy resin composition to form a molded part, wherein the molded part is disposed on at least a portion of the top surfaces of the lead electrodes and disposed at a region between the lead electrodes, whereby the molded part together with a portion of each of the lead electrodes form a recessed part for disposing at least an optical semiconductor element, wherein at least one of the side walls of the lead electrodes is not a straight line.

In one or some embodiments, there is no gap at a joint face between the molded part and the lead electrodes.

In one or some embodiments, the thermosetting epoxy resin composition includes at least one selected from the group consisting of a white pigment and an inorganic filler.

In one or some embodiments, the white pigment having a particle size ranges from 0.1 µm to 50 µm.

In one or some embodiments, the inorganic filler having a particle size ranges from 0.1 µm to 100 µm.

In one or some embodiments, the inorganic filler is at least a type selected from the group consisting of silica, alumina, magnesium oxide, antimony oxide, aluminum hydroxide, magnesium hydroxide, barium sulfate, magnesium carbonate, and barium carbonate.

In one or some embodiments, in at least one of the lead electrodes, an angle between the side wall of an opposite end of the lead electrode and the top surface of the lead electrode is within 90 degrees.

In one or some embodiments, at least one of the bottom surfaces of the lead electrodes is not in contact with the resin molding.

In one or some embodiments, a top view of the recessed part is round shaped.

In another embodiment, a method of manufacturing an optical semiconductor device is provided. The method comprises: disposing an optical semiconductor element on a recessed part of an optical semiconductor element mounting package, wherein the package having the recessed part comprises: at least two lead electrodes disposed opposite to and spaced apart from each other, wherein at least one of the lead electrodes is plated with a metal film; and a resin molding composed of a thermosetting light-reflecting resin composition on a portion of top surfaces of the lead electrodes by a molding technique to prepare a molded part, whereby the molded part together with the lead electrodes form the recessed part, and there is no gap at a joint face between the resin molding and the lead electrodes.

In one or some embodiments, the method further comprises disposing the optical semiconductor element on the top surfaces of the lead electrodes which form the recessed part together with the molded part formed from the thermosetting light-reflecting resin composition.

In one or some embodiments, side surfaces of the lead electrodes are non-linear.

In one or some embodiments, an outer surface of the resin molding and at least one of outer surfaces of the lead electrodes are planar at an outer surface of the package.

In one or some embodiments, a material of the metal film is silver, Nickel, aluminum, gold, palladium, or an alloy comprising any combination thereof.

In one or some embodiments, rear faces of the lead electrodes are not in contact with the resin molding.

In one or some embodiments, in at least one of the lead electrodes, at least a portion of the lead electrode has a thinner thickness as compared with rest portions of the lead electrode.

In one or some embodiments, the thermosetting light-reflecting resin composition includes a white pigment having a particle size ranges from 0.1 μm to 50 μm.

In one or some embodiments, one of the lead electrodes has a larger surface area as compared with rest of the lead electrodes.

In one or some embodiments, the method further comprises pressing a metal plate to punch out at least a metal strip so as to form the lead electrodes.

In one or some embodiments, the method further comprises etching a metal frame to form a circuit including the lead electrodes.

DISCLOSURE OF THE INVENTION

Optical semiconductor devices have come to be used in a wide range of fields, and it has become increasingly common in recent years for them to be used under harsh conditions, which means that these devices need to have higher reliability than what was needed in the past. However, the thermosetting resin compositions that are commonly used to produce the above-mentioned resin moldings have a coefficient of linear expansion (20 to 120 ppm/° C.) that is greater than the coefficient of linear expansion (approximately 17 ppm/° C.) of the copper that is typically used for lead electrodes, so a great deal of stress is generated when these materials are integrated, and this results in a decrease in adhesion between the resin molding and the lead electrodes, producing a gap on the order of a few dozen microns in between. If the adhesion between the resin molding and the lead electrodes decreases, the stress applied in the course of bending the outer leads of the lead electrodes will also create such a gap, and this lowers the reliability of the optical semiconductor device.

Also, if injection molding is employed in the production of a resin molding by injecting a resin composition into a mold, the injection pressure of the resin may produce a slight deformation of the mold, in which case resin flash (a parting line) is produced on the side faces of the optical semiconductor element mounting package. This resin flash becomes a hindrance in the forming process, and makes it extremely difficult to accurately work outer leads to match the outer faces of the resin molding in order to reduce the size of the optical semiconductor device. Also, stress is applied in the longitudinal direction at the boundary between the resin molding and the lead electrodes here, and a gap is produced at this boundary from the distal end portion of the flash extending in the lateral direction. Furthermore, there is the risk that the resin flash will separate, and if this happens, it can cause cracking in the package, moisture or foreign matter may get in through these cracks, and this greatly diminishes the reliability of the optical semiconductor device. Also, if the flash separation is deep, it can create a void that mars the appearance of the device.

Also, optical semiconductor elements having an emission peak wavelength in the ultraviolet band, for example, have been developed in recent years, and these elements hold much promise in their application to SMD-type LEDs, but because light near the ultraviolet band has such high energy, it tends to degrade the recessed part inner peripheral face (reflector) of the resin molding, and as this degradation of the inner peripheral face progresses, even reflectivity of visible light will decrease.

DISCLOSURE OF THE INVENTION

In view of this situation, according to an object of the present an disclosure, embodiment provides an optical semiconductor element mounting package that has good adhesion between the resin molding and the lead electrodes and has good reliability, as well as an optical semiconductor device using the package.

According to another object of the present disclosure, an embodiment provides an optical semiconductor element mounting package that has a recessed part (reflector) with high reflectivity of light ranging from visible light to near-ultraviolet light after curing, and good light resistance and thermal degradation resistance, as well as an optical semiconductor device using the package.

Specifically, an embodiment of the present disclosure is characterized by the following items (1) to (12).

(1) An optical semiconductor element mounting package having a recessed part that serves as an optical semiconductor element mounting region, wherein the package is formed by integrating: a resin molding composed of a thermosetting light-reflecting resin composition, which forms at least the side faces of the recessed part; and at least a pair of positive and negative lead electrodes disposed opposite to each other so as to form part of the bottom face of the recessed part, and there is no gap at a joint face between the resin molding and the lead electrodes.

(2) The optical semiconductor element mounting package according to (1) above, wherein the integration of the resin molding and the positive and negative lead electrodes is performed by transfer molding.

(3) The optical semiconductor element mounting package according to (1) or (2) above, wherein the thermosetting light-reflecting resin composition includes a filler.

(4) The optical semiconductor element mounting package according to (1) or (2) above, wherein the thermosetting light-reflecting resin composition includes components: (A) an epoxy resin; (B) a curing agent; (C) a curing accelerator; (D) an inorganic filler; (E) a white pigment; and (F) a coupling agent, and is a resin composition whose optical reflectivity at a wavelength of 350 to 800 nm is at least 80% and which can be press molded at normal temperature (0 to 35° C.)

(5) The optical semiconductor element mounting package according to (4) above, wherein the inorganic filler (D) is at least one type selected from the group consisting of silica, alumina, magnesium oxide, antimony oxide, aluminum hydroxide, magnesium hydroxide, barium sulfate, magnesium carbonate, and barium carbonate.

(6) The optical semiconductor element mounting package according to (4) or (5) above, wherein the white pigment (E) is inorganic hollow particles.

(7) The optical semiconductor element mounting package according to any of (4) to (6) above, wherein the average particle size of the white pigment (E) is between 0.1 and 50 μm.

(8) The optical semiconductor element mounting package according to any of (4) to (7) above, wherein the total amount of the inorganic filler (D) and the white pigment (E) is from 70 to 85 vol % with respect to the entire thermosetting light-reflecting resin composition.

(9) The optical semiconductor element mounting package according to any of (1) to (8) above, wherein the spiral flow of the thermosetting light-reflecting resin composition is at least 50 cm and no more than 300 cm.

(10) The optical semiconductor element mounting package according to any of (1) to (9) above, wherein the disk flow of the thermosetting light-reflecting resin composition is at least 50 mm.

(11) The optical semiconductor element mounting package according to any of (1) to (10) above, wherein the coefficient of linear expansion of the thermosetting light-reflecting resin composition is 10 to 30 ppm/° C.

(12) An optical semiconductor device, comprising: the optical semiconductor element mounting package according to any of (1) to (11) above; an optical semiconductor element mounted on the bottom face of a recessed part of the package; and a transparent sealing resin layer that covers the optical semiconductor element in the recessed part.

With the present disclosure, it is possible to provide an optical semiconductor element mounting package that has good adhesion between the resin molding and the lead electrodes and has good reliability, as well as an optical semiconductor device using the package, and furthermore it is possible to provide an optical semiconductor element mounting package that has a recessed part with high reflectivity of light ranging from visible light to near-ultraviolet light after curing, and good light resistance and thermal degradation resistance, as well as an optical semiconductor device using the package.

In the present disclosure, saying that "there is no gap" at the joint face between the resin molding and the lead electrodes refers to a state in which no gap is observed at the interface where the resin molding comes into contact with the lead electrodes when this interface is observed at a magnification of 200 times using a SEM, metal microscope, or the like.

Also, this application includes a claim of priority right based on Japanese Patent Application 2006-154652 (application date: Jun. 2, 2006) and the Specification thereof is included herein for the sake of reference.

The drawings are used for better understanding of the present invention, but not intended to limit the scope of the present invention.

DETAILED DESCRIPTION OF THE EMBODIMENTS

Figure 3:
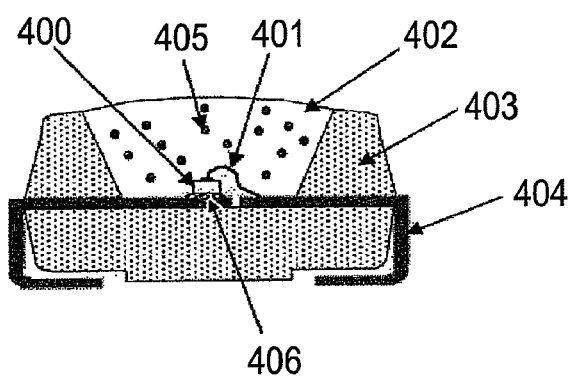
FIG. 3 is a cross section of a typical SMD-type LED (optical semiconductor device).

According to an embodiment of the present disclosure, the optical semiconductor element mounting package is an optical semiconductor element mounting package having a recessed part that serves as an optical semiconductor element mounting region, wherein the package is formed by integrating: a resin molding composed of a thermosetting light-reflecting resin composition, which forms at least the side faces of the recessed part; and at least a pair of positive and negative lead electrodes disposed opposite each other so as to form part of the bottom face of the recessed part, and there is no gap at the joint face between the resin molding and the lead electrodes. Preferably, one end of the positive lead electrode and one end of the negative lead electrode are disposed opposite each other so as to form the bottom face of the recessed part, with the surface (main face) of each exposed, and the ends are separated by molding resin in between them. It is also preferable if the other end of the positive lead electrode and the other end of the negative lead electrode are provided so as to protrude from the resin molding side faces immediately after integration with the resin molding, and the protruding outer lead parts thereof are, as shown in FIG. 3, for example, bent toward the inside of the joint face of the package molding, producing J-bend positive and negative connection terminals. Naturally, the structure of the connection terminals in the present embodiment is not limited to a J-bend type, and may be a gullwing type or another such structure.

The constitution and manufacturing method of the optical semiconductor element mounting package of the present embodiment, as well as an optical semiconductor device using the package, will now be described in detail.

<Lead Electrodes>

The lead electrodes can be constituted by steel-containing copper or another such material with high thermal conductivity. For example, if can be formed by using a press so as to punch out a metal strip composed of a copper alloy with a thickness of 0.15 mm. The surface of the lead electrodes may be plated with metal such as silver, aluminum, gold, palladium, and an alloy of these, etc., in order to prevent oxidation of the lead electrodes and so forth. Also, the surface of the lead electrodes is preferably made smooth in order to increase optical reflectivity from a light emitting element. Also, the surface area of the lead electrodes is preferably made as large as possible, which enhances heat dissipation, effectively suppresses an increase in the temperature of the light emitting element that is installed, and also allows more power to be sent to the light emitting element, so optical output can be increased.

Figure 4:
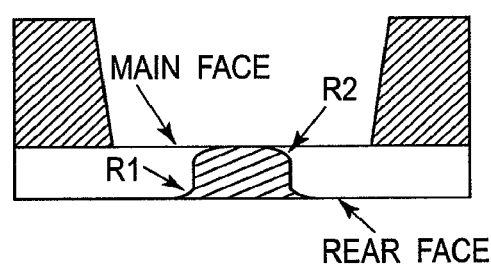
FIG. 4 is a cross section of an embodiment of the lead electrode ends of the optical semiconductor element mounting package of the present disclosure.

Also, according to an embodiment, at least a pair of positive and negative lead electrodes are disposed opposite each other so as to form part of the bottom face of the recessed part of the package, but preferably the corners at which the rear face and side faces intersect is curved at the ends of the opposite lead electrodes (see R1 in FIG. 4; furthermore, the "rear face of the lead electrode" is the back of the face (main face) exposed at the bottom of the recessed part of the package). If the lead electrode ends are thus rounded off in the direction in which the molding resin is injected, the molding resin will more readily fill in between the lead electrodes without leaving any gaps, the lead electrodes can be separated from one another more effectively, and adhesion is increased between the lead electrodes and the resin molding. Furthermore, since the joint line between the resin molding and the lead electrodes is curved, less stress will be concentrated at the joint line, and this reduces the occurrence of package cracking.

Meanwhile, according to an embodiment, the corners at which the side faces and the main face intersect at the ends of the opposite lead electrodes are preferably built up to an acute angle (see R2 in FIG. 4). This effectively prevents the molding resin from flowing out from between the lead electrodes onto the main face of the lead electrodes, and prevents defective die bonding or wire bonding of the light emitting element. It also increases adhesion between the lead electrodes and the molding resin, and reduces separation at the interface between them.

<Resin Molding>

According to an embodiment of the present disclosure, the resin molding in the package is preferably molded from a resin composition. The thermosetting light-reflecting thermosetting light-reflecting resin composition preferably contains a filler. Further, the thermosetting light-reflecting resin composition preferably contains components: (A) an epoxy resin; (B) a curing agent; (C) a curing accelerator; (D) an inorganic filler; (E) a white pigment; and (F) a coupling agent. The resin molding in the package of the present embodiment is preferably molded from a thermosetting light-reflecting resin composition. The thermosetting light-reflecting resin composition preferably contains a filler. Further, the thermosetting light-reflecting resin composition preferably contains components: (A) an epoxy resin; (B) a curing agent; (C) a curing accelerator; (D) an inorganic filler; (E) a white pigment; and (F) a coupling agent.

The above-mentioned epoxy resin (A) can be any commonly used epoxy resin molding material for sealing electronic components, examples of which include epoxified novolac resins of phenols and aldehydes, such as phenol novolac type epoxy resin or orthocresol novolac type epoxy resin; diglycidyl diethers of bisphenol A, bisphenol F, bisphenol S, and alkyl-substituted biphenol; glycidylamine type epoxy resins obtained by reacting epichlorohydrin and a polyamine such as isocyanuric acid and diaminodiphenylmethane; and linear aliphatic epoxy resins and alicyclic epoxy resins obtained by oxidizing olefin bonds with peracetic acid. Different kinds of these can also be used together. Of these, one with no coloration is preferable, examples of which include bisphenol A type epoxy resins, bisphenol F type epoxy resins, bisphenol S type epoxy resins, and triglycidyl isocyanurate.

There are no particular restrictions on the above-mentioned curing agent (B) as long as it will react with an epoxy resin, but one with relatively little coloration is preferable. Examples include acid anhydride-based curing agents and phenol-based curing agents. Examples of acid anhydride-based curing agents include phthalic anhydride, maleic anhydride, trimellitic anhydride, pyromellitic anhydride, hexahydrophthalic anhydride, tetrahydrophthalic anhydride, methyl nadic anhydride, nadic anhydride, glutaric anhydride, methylhexahydrophthalic anhydride, and methyltetrahydrophthalic anhydride. Of these acid anhydride-based curing agents, the use of phthalic anhydride, hexahydrophthalic anhydride, tetrahydrophthalic anhydride, or methylhexahydrophthalic anhydride is preferable. The acid anhydride-based curing agent preferably has a molecular weight of about 140 to 200, and an acid anhydride that is from colorless to pale yellow is preferred. These curing agents may be used singly, or two or more may be used together. It is preferable for the ratio of the epoxy resin and the curing agent to be such that active groups which can react with epoxy groups (acid anhydride groups or hydroxyl groups) in the curing agent account for 0.5 to 1.5 equivalents, and preferably from 0.7 to 1.2 equivalents, per epoxy group equivalent in the epoxy resin. Curing of the epoxy resin composition may be slower and the glass transition temperature of the cured product thus obtained may be lower if the active groups are less than 0.5 equivalent, and moisture resistance may decrease if 1.5 equivalents is exceeded.

There are no particular restrictions on the curing accelerator (C) (curing catalyst), but examples include tertiary amines such as 1, 8-diaza-bicyclo (5, 4, 0) undecene-7, triethylenediamine, and tri-2, 4, 6-dimethylaminomethylphenol; imidazoles such as 2-ethyl-4-methylimidazole and 2-methylimidazole; phosphorus compounds such as triphenylphosphine, tetraphenylphosphonium tetraphenylborate, and tetra-n-butylphosphonium,o,o-diethylphosphorodithioate; quaternary ammonium salts; organic metal salts; and derivatives of these. These can be used alone or together. Of these curing accelerators (curing catalysts), it is preferable to use a tertiary amine, an imidazole, or a phosphorus compound. The amount in which the curing accelerator is contained is preferably from 0.01 to 8.0 parts by weight (hereinafter referred to as "weight parts"), and more preferably from 0.1 to 3.0 weight parts, per 100 weight parts epoxy resin. A sufficient curing acceleration effect may not be obtained if the curing accelerator (curing catalyst) is contained in an amount of less than 0.01 weight parts, and the cured product may become discolored if the amount is over 8.0 weight parts.

The inorganic filler (D) can be at least one type selected from the group consisting of silica, alumina, magnesium oxide, antimony oxide, aluminum hydroxide, magnesium hydroxide, barium sulfate, magnesium carbonate, and barium carbonate, but a mixture of silica, alumina, antimony oxide, and aluminum hydroxide is preferable from the standpoints of thermal conductivity, optical reflection characteristics, moldability, and fire retardancy. Also, there are no particular restrictions on the average particle size of the inorganic filler, but a range of 0.1 to 100 μm is preferable because packing with the white pigment will be more efficient.

There are no particular restrictions on the white pigment (E), but inorganic hollow particles are preferable, examples of which include sodium silicate glass, aluminum silicate glass, sodium borate glass, alumina, and shirasu (Japanese volcanic ash). The average particle size of the white pigment is preferably between 0.1 and 50 μm. If it is less than 0.1 μm, the particles will tend to clump and not disperse as well, but if it is over 50 μm, adequate reaction characteristics will tend not to be obtained.

The total packing amount of the white pigment (E) and the inorganic filler (D) (the filler packing amount) is preferably between 70 and 85 vol % with respect to the total thermosetting light-reflecting resin composition. The optical reflection characteristics will tend to be inadequate if the filler packing amount is less than 70 vol %, but moldability will suffer and a substrate will tend to be more difficult to produce if the amount is over 85 vol %.

Examples of the coupling agent (F) include silane coupling agents and titanate coupling agents. Commonly used silane coupling agents include those based on epoxysilane, aminosilane, cationic silane, vinylsilane, acrylsilane, mercaptosilane, and compounds of these, which are often used in the desired application amount. There are no particular restrictions on the type of coupling agent or the processing conditions, but the amount of coupling agent contained in the thermosetting light-reflecting resin composition is preferably no more than 5 wt %.

In addition, an antioxidant, parting agent, ion sequestering agent, or the like may be added as needed to the thermosetting light-reflecting resin composition.

The thermosetting light-reflecting resin composition containing the above components is preferably press-moldable at room temperature (0 to 35° C.) prior to curing, and preferably has an optical reflectivity of at least 80% at a wavelength of 350 to 800 nm after curing. The above-mentioned press molding can be performed, for example, at room temperature, for about 1 to 5 seconds, at a pressure of 0.5 to 2 MPa. If the above-mentioned optical reflectivity is less than 80%, there will be a tendency for the composition not to contribute sufficiently to increasing the brightness of the optical semiconductor device. More preferably, the optical reflectivity is at least 90%.

The spiral flow of the thermosetting light-reflecting resin composition is preferably at least 50 cm and no more than 300 cm, and more preferably at least 50 cm and no more than 200 cm, with at least 50 cm and no more than 150 cm being particularly favorable. If the spiral flow is less than 50 cm, the material will not pack as well, so there will be a tendency for unpacked areas to remain in the product. On the other hand, if the spiral flow is over 300 cm, voids will be more likely to be generated, and bending strength will tend to decrease. The disk flow is preferably at least 50 mm, and more preferably at least 80 mm. If the disk flow is less than 50 mm, there will tend to be unpacked areas or voids between lead frames. The spiral flow here is the value obtained by injecting the resin composition (at an injection pressure of 6.9 MPa) into a metal mold (with a mold temperature of 180° C.) having a spiral groove, and measuring the length of the packed swirl until the resin composition cures. The disk flow is the value obtained by placing 5 g of resin composition between two flat plates of a metal mold (with a mold temperature of 180° C. and a mold weight of 8 kg), and measuring the diameter of the circle over which the resin composition spreads and wets under the weight of the mold.

The coefficient of linear expansion of the thermosetting light-reflecting resin composition is preferably from 10 to 30 ppm/° C. The coefficient of linear expansion here can be found for the thermosetting light-reflecting resin composition either right after it is molded or after it has cured.

Figure 1:
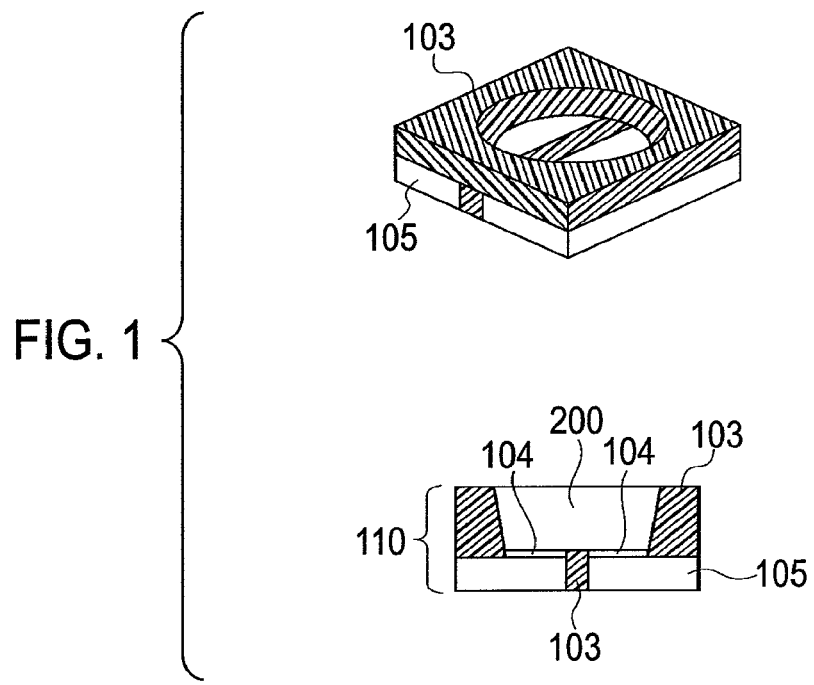
FIG. 1 is an oblique view and a cross section of an embodiment of the optical semiconductor element mounting package of the present disclosure.

There are no particular restrictions on the shape of the resin molding so long as it has a recessed part that serves as the region for mounting an optical semiconductor element as described above, but it is preferable that the recessed part side wall (reflector) has a shape to allow light to be reflected upward from the optical semiconductor element. FIG. 1 illustrates an embodiment of an optical semiconductor element mounting package 110 of the present invention, comprising a resin molding 103, lead electrodes 105, a recessed part 200 that serves as the region for mounting an optical semiconductor element, and a Ni/Ag plating film 104.

<Method for Manufacturing a Package>

There are no particular restrictions on the method for manufacturing the optical semiconductor element mounting package, but preferably the thermosetting light-reflecting resin composition and the lead electrodes are formed integrally by transfer molding. Forming them by transfer molding makes it less likely that there will be a gap between the lead electrodes and the resin molding. More specifically, for example, the lead electrodes are placed in a metal mold of a specific shape, a thermosetting light-reflecting resin composition is injected through a resin injection opening in the mold, and the composition is preferably cured at a mold temperature of 170 to 190° C., a molding pressure of 2 to 8 MPa, and for 60 to 120 seconds. The molding is taken out of the mold, and then heat cured for 1 to 3 hours at an after-curing temperature of 120 to 180° C.

<Optical Semiconductor Device>

According to an embodiment of the present disclosure, the optical semiconductor device comprises at least the optical semiconductor element mounting package of the present invention, an optical semiconductor element mounted on the bottom face of a recessed part of this optical semiconductor element mounting package, and a transparent sealing resin layer formed in the recessed part so as to cover an optical semiconductor element.

The above-mentioned optical semiconductor element (light emitting element) is disposed, for example, on a negative lead electrode or a positive lead electrode exposed on the bottom face of the recessed part of the package, the n electrode and the negative lead electrode are connected by wire bonding, and similarly the p electrode and the positive lead electrode are connected by wire bonding. Also, in an element configuration in which the n electrode is formed at the top part of the light emitting element and the p electrode is formed at the bottom part of the light emitting element, the p electrode is bonded by silver paste or another such die bonding material on the positive lead electrode, while the n electrode and the negative lead electrode are connected by wire bonding. Disposing the light emitting element on the lead electrodes in this manner is favorable because heat dissipation from the light emitting element is improved. The light emitting element here is a gallium nitride compound semiconductor element capable of emitting blue light, for example, and said element is configured, for example, such that nitride semiconductor layers including an n-type layer, an active layer, and a p-type layer is formed on a sapphire substrate, parts of the active layer and the p-type layer are removed and an n electrode is formed over the exposed n-type layer, and a p electrode is formed over the p-type layer.

The above-mentioned transparent sealing resin layer protects the light emitting element from external force, moisture, and so forth. With a structure in which the lead electrodes and the electrodes of the light emitting element are connected with wires, this layer also functions to protect these wires. The transparent sealing resin layer also needs to be highly transmissive to light so that the light from the light emitting element can be efficiently transmitted to the outside. As to the specific material of the transparent sealing resin used in the transparent sealing resin layer, epoxy resins, silicone resins, acrylic resins, and the like are suitable, and a coloring dye or pigment can also be added in order to subject the light from the light emitting element to a specific filtering effect.

Figure 2:
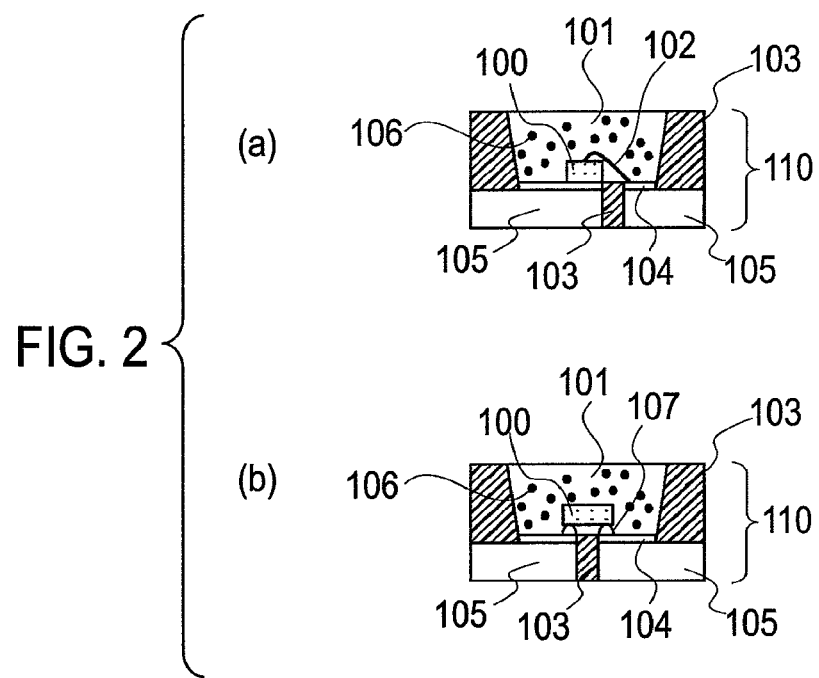
FIG. 2 is a cross section of an embodiment of the optical semiconductor device of the present disclosure.

FIG. 2 illustrates an embodiment of the optical semiconductor device of the present disclosure, in which an optical semiconductor element 100 is mounted at a specific location on the bottom of an optical semiconductor element mounting region (recessed part) 200 of the optical semiconductor element mounting package 110 of the present embodiment, the optical semiconductor element 100 and lead electrodes 105 are electrically connected by a known method such as with a bonding wire 102 or solder bump 107, and the optical semiconductor element 100 is covered by a transparent sealing resin 101 that includes a known fluorescent material 106.

EXAMPLES

The present invention will now be described by giving examples, but the present invention is not limited to or by these examples.

Example 1

(Lead Frame)

A copper frame with a thickness of 0.15 mm was subjected to a standard photoetching process to form a circuit including lead electrodes, after which this circuit was subjected to silver electroplating to produce a lead frame.

TABLE 1

<Thermosetting Light-Reflecting Resin Composition>

| | |
|---|---|
| epoxy resin: | 100 weight parts |
| triglycidyl isocyanurate | (100 epoxy equivalents) |
| curing agent: | 140 weight parts |
| hexahydrophthalic anhydride | |
| curing accelerator: | 2.4 weight parts |
| tetra-n-butylphosphonium-o,o-diethylphosphorodithioate | |
| inorganic filler: | 600 weight parts |
| molten silica | |
| (20 μm average particle size) | |
| alumina (1 μm average particle size) | 890 weight parts |
| white pigment: | 185 weight parts |
| sodium borate glass balloons | |
| (27 μm average particle size) | |
| coupling agent: | 19 weight parts |
| γ-glycidoxypropyltrimethoxysilane | |
| antioxidant: | 1 weight part |
| 9,10-dihydro-9-oxa-10-phosphapheninthrene-10-oxide | |

A material with the above composition was kneaded with a roll for 10 minutes at a kneading temperature of 30 to 40° C. to produce a thermosetting light-reflecting resin composition. The spiral flow of the resulting resin composition was 140 cm (curing time of 90 seconds), and the disk flow was 85 mm (curing time of 90 seconds). The optical reflectivity of the resulting resin composition was over 90%. This optical reflectivity value was obtained as follows. The above-mentioned resin composition was transfer molded at a molding temperature of 180° C., a molding pressure of 6.9 MPa, and a curing time of 90 seconds, after which it was post-cured for 2 hours at 150° C. to produce a test piece with a thickness of 2.0 mm. The reflectivity of this test piece was measures at a wavelength of 350 to 850 nm using a model V-750 integrating sphere type of spectrophotometer (made by JASCO Corporation).

(Formation of Optical Semiconductor Element Mounting Package)

The lead frame obtained above was positioned in and attached to a metal mold, the thermosetting light-reflecting resin composition obtained above was injected into the mold, and transfer molding was performed at a mold temperature of 180° C., for 90 seconds, at 6.9 MPa, which produced an optical semiconductor element mounting package that had a recessed part in the element mounting region and in which the positive and negative lead electrodes were exposed at the bottom face of this recessed part.

(Manufacture of Optical Semiconductor Device)

An LED element was fixed with a die bonding material to the lead electrodes on the bottom face of the recessed part of the optical semiconductor element mounting package obtained above, and the LED element was affixed over a terminal by heating for 1 hour at 150° C. After this, the LED element and the terminal were electrically connected with a gold wire.

Net, a transparent sealing resin with the following composition was applied by potting to the above-mentioned recessed part so as to cover the LED element, then heated and cured for 2 hours at 150° C. to produce an optical semiconductor device (SMD-type LED).

TABLE 2

<Composition of Transparent Sealing Resin>

| | |
|---|---|
| hydrogenated bisphenol A type epoxy resin (trade name Denacol EX252, made by Nagase ChemteX) | 90 weight parts |
| alicyclic epoxy resin (trade name CEL-2021P, made by Daicel) | 10 weight parts |
| 4-methylhexahydrophthalic anhydride (trade name HN-5500E, made by Hitachi Chemical) | 90 weight parts |
| 2,6-di-tert-butyl-4-methylphenol BHT | 0.4 weight part |
| 2-ethyl-4-methylimidazole | 0.9 weight part |

Example 2

TABLE 3

<Thermosetting Light-Reflecting Resin Composition>

| | |
|---|---|
| epoxy resin: | 100 weight parts |
| triglycidyl isocyanurate | (100 epoxy equivalents) |
| curing agent: | 125 weight parts |
| hexahydrophthalic anhydride | |
| curing accelerator: | 2.4 weight parts |
| tetra-n-butylphosphonium-o,o-diethylphosphorodithioate | |
| inorganic filler: | 720 weight parts |
| molten silica | |
| (20 μm average particle size) | |
| alumina (1 μm average particle size) | 640 weight parts |
| white pigment: | 435 weight parts |
| silica balloons | |
| (3 μm average particle size) | |
| coupling agent: | 9 weight parts |
| γ-glycidoxypropyltrimethoxysilane | |
| antioxidant: | 1 weight part |
| 9,10-dihydro-9-oxa-10-phosphaphenanthrene-10-oxide | |

A material with the above composition was kneaded with a roll for 10 minutes at a kneading temperature of 30 to 40° C. to produce a thermosetting light-reflecting resin composition. The spiral flow of the resulting resin composition was 100 cm (curing time of 90 seconds), and the disk flow was 55 mm (curing time of 90 seconds). The optical reflectivity of the resulting resin composition after curing was over 90% (350 to 850 nm).

The thermosetting light-reflecting resin composition obtained above was used to produce an optical semiconductor element mounting package and an optical semiconductor device in the same manner as in Example 1.

The optical semiconductor devices of the examples manufactured as above had good bonding strength at the interface between the leads and the package, and no gaps were noted at this interface. Each device was allowed to stand for 24 hours at 85° C. and 85% relative humidity (RH), after which the interface between the resin molding and the transparent sealing resin layer or the lead electrodes was checked for separation, but no separation was noted, and it was confirmed that almost no moisture had infiltrated. Therefore, the optical semiconductor devices of the examples can be considered to have good reliability, such as reflow resistance and migration resistance.

What is claimed is:

1. A method of manufacturing an optical semiconductor device, comprising:
   disposing an optical semiconductor element on at least one of at least two lead electrodes of an optical semiconductor element mounting package, wherein the package comprises:
      the at least two lead electrodes disposed opposite to and spaced apart from each other, each of the at least two lead electrodes having a top surface and a bottom surface, wherein the at least two lead electrodes are flat, and each of the at least two lead electrodes in its entirety is not bent; and
      a resin molded part disposed on the top surfaces of the at least two lead electrodes to form a side wall continuously surrounding the optical semiconductor element, wherein the resin molded part is configured to be in contact with outer side surfaces of the at least two lead electrodes, but the resin molded part is not in contact with the bottom surfaces of the at least two lead electrodes;
   wherein the resin molded part contains an inorganic filler;
   wherein the package has a recessed part that serves as an optical semiconductor element mounting region;
   wherein portions of the top surfaces of the at least two lead electrodes form a part of a bottom face of the recessed part;
   wherein the resin molded part is composed of a thermosetting light-reflecting resin composition, the resin molded part comprises a first portion and a second portion, the first portion forms the side wall continuously surrounding the optical semiconductor element, the first portion is configured to be in contact with the outer side surfaces of the at least two lead electrodes, the second portion is filled up a space between the at least two lead electrodes so as to form the rest part of the bottom face of the recessed part, and the first portion and the second portion form a T-shape profile from a side view of the package;
   wherein the thermosetting light-reflecting resin composition comprises a white pigment with hollow inorganic particles having a particle size ranges from 0.1 μm to 50 μm;
   wherein length directions of the at least two lead electrodes and a length direction of the second portion of the resin molded part are parallel to each other;
   wherein the bottom surfaces of the at least two lead electrodes in its entirety and a bottom surface of the second portion of the resin molded part form a bottom surface of the package, and the bottom surface of the package is a flat surface.

2. The method of manufacturing an optical semiconductor device according to claim 1, wherein there is no gap at a joint face between the resin molded part and the at least two lead electrodes.

3. The method of manufacturing an optical semiconductor device according to claim 1, wherein the inorganic filler having a particle size ranges from 0.1 μm to 100 μm.

4. The method of manufacturing an optical semiconductor device according to claim 1, wherein in at least one of the at least two lead electrodes, an angle between the opposite side surface of the at least two lead electrode and the top surface of the at least two lead electrode is within 90 degrees.

5. The method of manufacturing an optical semiconductor device according to claim 1, wherein a top view of an inner wall of the resin molded part is round shaped.

6. A method of manufacturing an optical semiconductor device, comprising:
   disposing an optical semiconductor element on at least one of at least two lead electrodes of an optical semiconductor element mounting package, wherein the package comprises:
      the at least two lead electrodes disposed opposite to and spaced apart from each other, each of the at least two lead electrodes having a top surface and a bottom surface, wherein at least one of the at least two lead electrodes is plated with a metal film; and
      a resin molding disposed on the top surfaces of the at least two lead electrodes to form a side wall continuously surrounding the optical semiconductor element, wherein the resin molding is configured to be in contact with outer side surfaces of the at least two lead electrodes, but the resin molding is not in contact with the bottom surface of the at least two lead electrodes;
   wherein the at least two lead electrodes are flat, and each of the at least two lead electrodes in its entirety is not bent, and at least a portion of the at least two lead electrodes has a thinner thickness as compared with other portions of the at least two lead electrodes; and
   disposing a sealing member covering the optical semiconductor element;
   wherein the resin molding contains an inorganic filler;
   wherein the package has a recessed part that serves as an optical semiconductor element mounting region;
   wherein portions of the top surfaces of the at least two lead electrodes form a part of a bottom face of the recessed part;
   wherein the resin molding is composed of a thermosetting light-reflecting resin composition, the resin molding comprises a first portion and a second portion, the first portion forms the side wall continuously surrounding the optical semiconductor element, the first portion is configured to be in contact with the outer side surfaces of the at least two lead electrodes, the second portion is filled up a space between the at least two lead electrodes so as to form the rest part of the bottom face of the recessed part, and the first portion and the second portion form a T-shape profile from a side view of the package;
   wherein the thermosetting light-reflecting resin composition comprises a white pigment with hollow inorganic particles having a particle size ranges from 0.1 μm to 50 μm;
   wherein length directions of the at least two lead electrodes and a length direction of the second portion of the resin molding are parallel to each other;
   wherein the bottom surfaces of the at least two lead electrodes in its entirety and a bottom surface of the second portion of the resin molding form a bottom surface of the package, and the bottom surface of the package is a flat surface.

7. The method of manufacturing an optical semiconductor device according to claim 6, wherein an outer surface of the resin molding and at least one of outer surfaces of the at least two lead electrodes are planar at an outer surface of the package.

8. The method of manufacturing an optical semiconductor device according to claim 6, wherein a material of the metal film is silver, Nickel, aluminum, gold, palladium, or an alloy comprising any combination thereof.

9. The method of manufacturing an optical semiconductor device according to claim 6, wherein one of the at least two lead electrodes has a larger surface area as compared with rest of the at least two lead electrodes.

10. The method of manufacturing an optical semiconductor device according to claim 6, further comprising:
pressing a metal plate to punch out at least a metal strip so as to form the at least two lead electrodes.

11. The method of manufacturing an optical semiconductor device according to claim 6, further comprising:
etching a metal frame to form a circuit including the at least two lead electrodes.

12. The method of manufacturing an optical semiconductor device according to claim 6, wherein the inorganic filler has a particle size ranges from 0.1 μm to 100 μm.

13. The optical semiconductor device according to claim 6, wherein the at least two lead electrodes include a positive lead electrode and a negative lead electrode, and the optical semiconductor element includes a first electrode and a second electrode electrically connected to the positive lead electrode and the negative lead electrode by conductive wires, respectively.

14. The optical semiconductor device according to claim 6, wherein the at least two lead electrodes include a positive lead electrode and a negative lead electrode, and the optical semiconductor element includes:
a first electrode formed at a bottom part of the optical semiconductor element and bonded to one of the positive lead electrode and the negative lead electrode; and
a second electrode formed at a top part of the optical semiconductor element and electrically connected to the other one of the positive lead electrode and the negative lead electrodes by a conductive wire, wherein in a recessed part of the resin molding, the one of the positive lead electrode and the negative lead electrode has a first exposed area, the other one of the positive lead electrode and the negative lead electrode has a second exposed area, and the first exposed area is greater than the second exposed area.

15. The optical semiconductor device according to claim 6, wherein the at least two lead electrodes include a positive lead electrode and a negative lead electrode, and the optical semiconductor element includes:
a first electrode formed at a bottom part of the optical semiconductor element and electrically connected to one of the positive lead electrode and the negative lead electrode; and
a second electrode formed at the bottom part of the optical semiconductor element and electrically connected to the other one of the positive lead electrode and the negative lead electrode.

16. A method of manufacturing a light emitting device, comprising:
disposing at least one light emitting element on at least one lead electrode of a resin package, wherein the resin package having a recessed part comprises:
at least one lead electrode, wherein the at least lead electrode is flat and in its entirety not bent; and
a resin molding disposed on a portion of a main face of the at least one lead electrode and is not in contact with a rear face of the at least one lead electrode;
wherein the resin molding and the at least one lead electrode are co-planar at an outer face of the resin package;
wherein the at least one lead electrode comprises at least two lead electrodes, and each of the at least two lead electrodes has a top surface and a bottom surface, and portions of the top surface of the at least two lead electrodes form a part of a bottom face of the recessed part;
wherein the resin molding is composed of a thermosetting light-reflecting resin composition, the resin molding comprises a first portion and a second portion, the first portion forms the side wall continuously surrounding the optical semiconductor element, the first portion is configured to be in contact with the outer side surfaces of the at least two lead electrodes, the second portion is filled up a space between the at least two lead electrodes so as to form the rest part of the bottom face of the recessed part, and the first portion and the second portion form a T-shape profile from a side view of the package;
wherein the thermosetting light-reflecting resin composition comprises a white pigment with hollow inorganic particles having a particle size ranges from 0.1 μm to 50 μm;
wherein length directions of the at least two lead electrodes and a length direction of the second portion of the resin molding are parallel to each other;
wherein the bottom surfaces of the at least two lead electrodes in its entirety and a bottom surface of the second portion of the resin molding form a bottom surface of the package, and the bottom surface of the package is a flat surface.

17. The method of manufacturing a light emitting device according to claim 16, wherein each of the at least two lead electrodes includes a metal film on at least a portion of the top surface of the at least two lead electrodes.

18. The method of manufacturing a light emitting device according to claim 16, wherein a material of the white pigment includes at least one selected from the group consisting of sodium silicate glass, aluminum silicate glass, sodium borate glass, alumina, and shirasu.

19. The method of manufacturing a light emitting device according to claim 16, wherein the at least two lead electrodes include a positive lead electrode and a negative lead electrode, and the positive lead electrode and the negative lead electrode are electrically connected with conductive wires, respectively.

20. The method of manufacturing a light emitting device according to claim 19, wherein the at least two lead electrodes include a positive lead electrode and a negative lead electrode, and the at least one light emitting element includes:
a first electrode formed at a bottom part of the at least one light emitting element and bonded to one of the positive lead electrode and the negative lead electrode; and
a second electrode formed at a top part of the at least one light emitting element and electrically connected to the other one of the positive lead electrode and the negative lead electrode by a conductive wire.

21. The method of manufacturing a light emitting device according to claim 16, wherein the at least two lead electrodes include a positive lead electrode and a negative lead electrode, and the at least one light emitting element includes: a first lead electrode and a second lead electrode which are formed at a bottom part of the at least one light emitting element and electrically connected to the positive lead electrode and the negative lead electrode, respectively.

* * * * *